US006356025B1

(12) United States Patent
Freeman et al.

(10) Patent No.: US 6,356,025 B1
(45) Date of Patent: Mar. 12, 2002

(54) SHIELDED RF ANTENNA

(75) Inventors: Richard L. Freeman, Del Mar; Robert L. Miller, San Diego, both of CA (US)

(73) Assignee: Archimedes Technology Group, Inc., San Diego, CA (US)

( * ) Notice: Subject to any disclaimer, the term of this patent is extended or adjusted under 35 U.S.C. 154(b) by 0 days.

(21) Appl. No.: 09/678,646

(22) Filed: Oct. 3, 2000

(51) Int. Cl.[7] .................................................. H01J 7/24
(52) U.S. Cl. ................... 315/111.51; 343/867; 422/906
(58) Field of Search ...................... 315/111.21, 111.51; 343/732, 742, 841, 842, 866, 867; 204/192.12; 156/345; 422/906

(56) References Cited

U.S. PATENT DOCUMENTS

| | | | |
|---|---|---|---|
| 3,780,309 A | 12/1973 | Bochard | 250/507 |
| 4,987,007 A | 1/1991 | Wagal | 427/53.1 |
| 5,681,434 A | 10/1997 | Eastlund | 204/156 |
| 5,904,780 A | * 5/1999 | Tomoyasu | 156/345 |
| 5,961,793 A | * 10/1999 | Ngan | 204/192.12 |
| 6,096,220 A | 8/2000 | Ohkawa | 210/695 |
| 6,228,229 B1 | * 5/2001 | Raaijmakers et al. | 204/192.12 |

* cited by examiner

*Primary Examiner*—Don Wong
*Assistant Examiner*—Thuy Vinh Tran
(74) *Attorney, Agent, or Firm*—Nydegger & Associates

(57) ABSTRACT

A device for generating a plasma includes an enclosed chamber and an antenna positioned adjacent the wall of the chamber. A ceramic shield is mounted on the wall, with the antenna located between the wall and the ceramic shield. There is also a barrier that is mounted on the wall with the ceramic shield being between the barrier and the antenna element. An alternating voltage source is provided to energize the antenna element to generate a plasma in the chamber. In operation, the ceramic shield isolates the antenna from the plasma in the chamber, and the barrier prevents the deposition of material components from the plasma on the ceramic shield.

18 Claims, 1 Drawing Sheet

SHIELDED RF ANTENNA

FIELD OF THE INVENTION

The present invention pertains generally to rf antennas. More particularly, the present invention pertains to rf antennas that are useful for generating plasmas. The present invention is particularly, but not exclusively, useful as a shielded rf antenna which is protected from the adverse effects of plasma deposits during its operation.

BACKGROUND OF THE INVENTION

Radio frequency (rf) power is a well known means for producing and heating the plasmas that are needed for processing materials or separating masses. There are, however, limitations to the use of rf power for these purposes. In some applications, such as where there are high levels of radiation, or the size of the plasma chamber is particularly large, the power requirements for generating and maintaining a suitable plasma are very high. Moreover, it happens that for high power applications, conventional rf antenna configurations are susceptible to breakdown between the antenna elements and the adjacent grounded structure. Another problem is encountered when deposits from the plasma develop on the rf antenna and absorb or prevent the transmission of rf power from the antenna.

One solution to the problems mentioned above is to house the rf antenna elements in a separate compartment that will isolate the elements from the plasma. Such a compartment can then be pumped or pressurized, as required, to avoid the breakdown between the antenna elements and the grounded structure. For this purpose, it is known that certain ceramics have sufficient structural strength to withstand the pressure differentials that may be used. Further, many of these ceramics are known to be generally transparent to rf power. It is a concern, however, that the ceramic facing of such a compartment is particularly susceptible to the accumulation of depositions from a plasma when it is in direct contact with the plasma. The consequence then is that the depositions on the ceramic facing absorb rf power. As indicated above, this will eventually cause the rf antenna to become ineffective. This problem is particularly acute when the plasma is a metallic plasma.

In light of the above, it is an object of the present invention to provide a device for generating a plasma which uses a ceramic shield to encase or enclose an antenna element that is capable of generating very high rf powers. It is another object of the present invention to provide a device for generating a plasma which incorporates a Faraday shield (cage) to effectively protect the ceramic shield from material deposits that can absorb rf power and thereby significantly diminish the effectiveness of the device. Yet another object of the present invention is to provide a device for generating a plasma that is relatively easy to manufacture, is simple to use and is comparatively cost effective.

SUMMARY OF THE PREFERRED EMBODIMENTS

In accordance with the present invention, a device for generating a plasma includes an enclosed chamber, and an antenna that is positioned adjacent to the inside wall of the chamber. As intended for the present invention, the chamber is substantially cylindrical and defines a longitudinal central axis with the antenna centered on the axis. Importantly, elements of the antenna are positioned around the chamber inside a substantially annular shaped pressure compartment.

For its construction, the pressure compartment housing the antenna elements is formed at the wall of the chamber and includes a pair of metal side walls. More specifically, the metal side walls are substantially parallel to each other, and they extend inwardly from the wall of the chamber toward the central axis. A ceramic shield is attached to the extended edges of the side walls and, with the ceramic shield so attached, the pressure compartment is formed. Structurally, the pressure compartment is established between opposed side walls, and between the ceramic shield and the wall of the chamber.

As mentioned above, the antenna elements of the present invention are located inside the pressure compartment, between the shield and the wall of the chamber. This is done so that the ceramic shield will effectively isolate the antenna elements from the inside of the plasma chamber. Specifically, as will be appreciated by the skilled artisan, an isolated antenna element inside the pressure compartment can operate in a different, more favorable pressure environment for the antenna than that which may be required in the plasma chamber itself. Further, the ceramic shield allows the antenna elements to radiate the rf power into the chamber. Preferably, the ceramic shield is made of a material that will be effectively transparent to rf energy, such as quartz. Behind the ceramic shield, the antenna will preferably include a plurality of elements that are substantially circular loops that are connected to a source of alternating voltage. Power from this voltage source can then be radiated from the rf antenna element into the chamber. For specific applications, the voltage source may also be used to control the relative phase of the rf power in adjacent loops of the antenna.

In addition to the antenna elements that are located inside the pressure compartment, the device of the present invention also includes a barrier that is mounted on the device outside the pressure compartment, but inside the chamber. This barrier is preferably a structure of a type commonly known as a non-transparent Faraday shield (cage). As used for the present invention, this barrier is positioned with the antenna element and ceramic shield between the barrier and the wall of the chamber. Thus, in a radial direction toward the axis of the chamber, the device of the present invention includes the wall of the chamber, an antenna element, a ceramic shield, and a barrier. The plasma chamber is then established between the barrier and the axis of the chamber.

In its preferred embodiment, the barrier of the present invention includes an inner perforated layer having a plurality of elongated openings and an outer perforated layer also having a plurality of elongated openings. Both of these layers, the inner and the outer layers, are substantially cylindrical in shape and they are coaxially oriented along the central axis of the chamber with the inner layer being closest to the axis. The elongated openings through both the inner layer and the outer layer are aligned generally parallel to the central axis of the chamber. Furthermore, the openings through the inner layer are offset from the openings through the outer layer such that, in a radial direction from the central axis, the ceramic shield is blocked from the chamber by at least one of the layers.

During an operation of the device of the present invention, the antenna elements are energized by an alternating voltage source. The resultant rf power from the antenna is then radiated through the ceramic shield, past the barrier (Faraday shield) and into the plasma chamber. Inside the plasma chamber, the rf power will then interact with vapors to create a plasma. It will happen that as the plasma is created inside the chamber by the rf power from the antenna, the plasma will include material components that can precipitate out of the plasma. The barrier (Faraday shield), however, prevents material components in the plasma from being deposited on the ceramic shield. Thus, the rf power is not affected by material deposits on the ceramic shield which could, otherwise, absorb the rf power and significantly diminish the effectiveness of the antenna element.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENT

Figure 1:
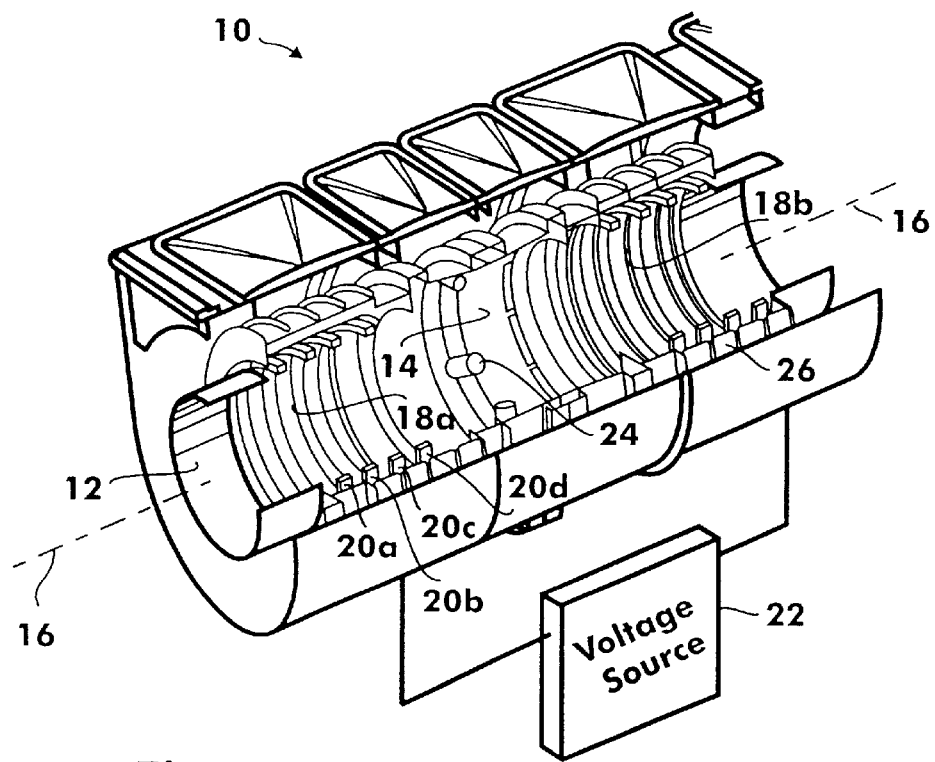
FIG. 1 is a perspective view of a plasma chamber incorporating a shielded rf antenna of the present invention, with portions broken away for clarity.

Referring initially to FIG. 1, a plasma generator incorporating the present invention is shown and is generally designated 10. As shown, the plasma generator 10 includes a generally cylindrical shaped wall 12 that surrounds a plasma chamber 14. Structurally, the wall 12 defines a longitudinal axis 16 that extends along the length of the chamber 14. As intended for the present invention, the plasma generator 10 may include a plurality of magnetic coils (not shown). If used, the coils are positioned outside the chamber 14, and they are oriented substantially perpendicular to the axis 16 for the purpose of generating a generally axially oriented magnetic field, B, inside the chamber 14. FIG. 1 further shows that the plasma generator 10 includes an antenna 18a and an antenna 18b with antenna elements 20a, 20b, 20c and 20d for antenna 18a being exemplary.

In accordance with the present invention, the antenna elements 20a–d are connected with a voltage source 22 for the purpose of generating rf power. With the antenna elements 20a–d oriented substantially as shown in FIG. 1, this rf power is radiated radially into the chamber 14 toward the axis 16. Further, as shown, the plasma generator 10 includes a vapor injector 24 that is operated to provide a vapor inside the chamber 14. Thus, by physical principles well known to the skilled artisan, rf power from the antennae 18a and 18b can be used to convert the vapors that are provided by the vapor injector 24 into a plasma.

Figure 2:
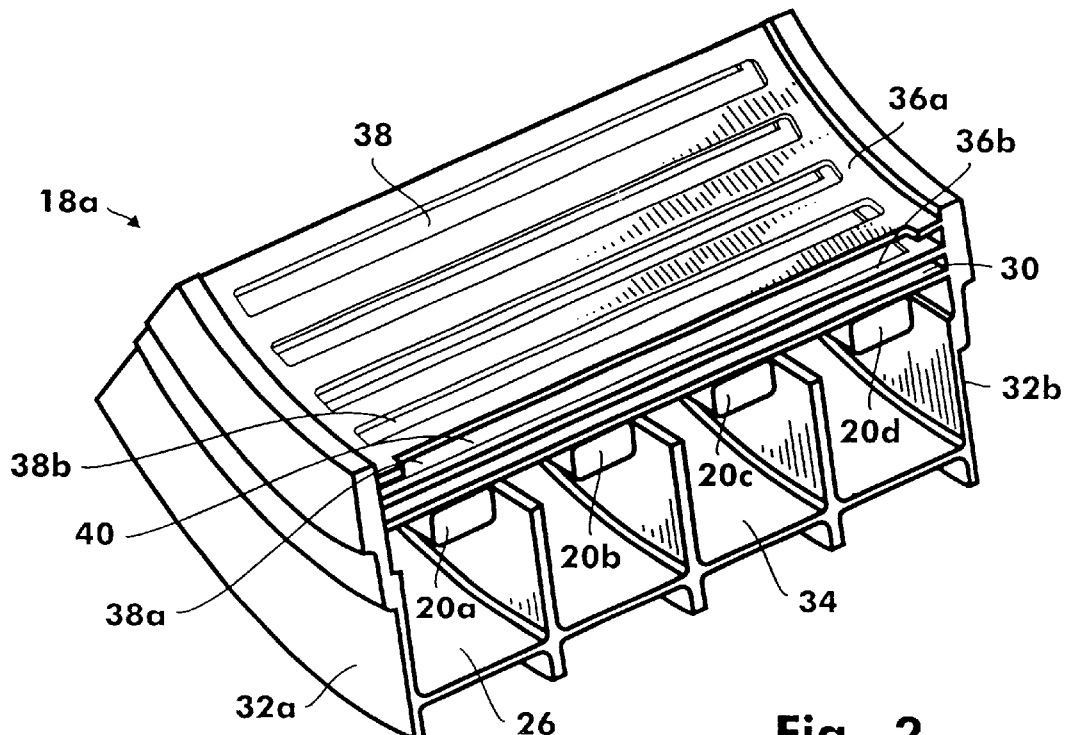
FIG. 2 is a perspective view of a pressure compartment in accordance with the present invention enclosing part of the rf antenna elements behind a ceramic shield and a Faraday shield (cage), with portions of the pressure compartment removed for clarity.

In FIG. 2 it will be seen that each antenna 18 includes an inside wall 26 and that each antenna element 20 is a metal loop which is positioned near the inside wall 26 (the antenna elements 20a–d are only exemplary). By cross-referencing FIG. 2 with FIG. 1, it is to be appreciated that the antenna elements 20a–d (metal loops) extend completely around the chamber 14. Also seen in FIG. 2 is a ceramic shield 30. Specifically, this ceramic shield 30 is supported at a distance from the inside wall 26 by a pair of side walls 32a and 32b. Thus, with the antenna elements 20a–d positioned as shown between the inside wall 26 and the ceramic shield 30, and between the side walls 32a and 32b, the antenna elements 20a–d are effectively enclosed in a pressure compartment 34. Importantly, the ceramic shield 30 is made of a ceramic material that is effectively transparent to rf power, and that has sufficient strength to withstand operational pressure differences between the pressure compartment 34 and the inside of the plasma chamber 14. Preferably, the ceramic shield 30 is made of a material such as quartz or alumina.

Still referring to FIG. 2, it will be seen that the antenna 18a also includes an inner layer 36a and an outer layer 36b. As intended for the present invention, both of these layers 36a and 36b are substantially cylindrical in shape and they extend along the axis 16 in order to conform with the ceramic shield 30. Thus, they are coaxially oriented along the central axis 16 of the chamber 14 and, as shown, the inner layer 36a is positioned closest to the axis 16. Together, the inner layer 36a and the outer layer 36b form a barrier 40 which, as more fully disclosed below, effectively protects the ceramic shield 30 from the inside of the chamber 14.

As shown in the FIG. 2, both of the layers 36a and 36b are formed with respective elongated openings 38 that extend radially through the respective layers 36a and 36b. In more detail, these elongated openings 38 are all aligned generally parallel to the central axis 16 of the chamber 14. Further, the openings 38 are arranged in rows and columns on the layers 36 to give the respective layers 36a and 36b an appearance of being hollow cylinders that are individually formed with a plurality of axially oriented slats. Furthermore, as best seen in FIG. 2, the openings 38 through the inner layer 36a are offset from the openings 38 through the outer layer 36b such that the layers 36a and 36b effectively overlap. Specifically, consider the elongated opening 38a through inner layer 36a in its relationship with the elongated opening 38b through outer layer 36b. Further, consider a straight line radially directed outward from the axis 16. As can be appreciated from FIG. 2, the offset of openings 38 (as exemplified by the offset of opening 38a from opening 38b) is such that there can be no uninterrupted, line-of-sight, path between the axis 16 and the ceramic shield 30 inside the chamber 14. Stated differently, in a radial direction from the central axis 16, the ceramic shield 30 is protected (i.e. blocked) from the chamber 14 by at least one of the layers 36 in the barrier 40.

In the operation of the plasma generator 10, vapors from the vapor injector 24 are first introduced into the chamber 14. The antenna elements 20 then radiate rf power into the chamber 14 to convert the vapors into a plasma. For the present invention, the rf power from all of the antenna elements 20a–d can be in phase, or the phases between antenna elements 20 can be different, as desired. In any event, as is well known in the pertinent art, particularly when the plasma is a metallic plasma, material from the plasma can be deposited onto surfaces when the plasma comes into contact with the surface. In order to prevent this from happening to the ceramic shield 30, the barrier 40 is interposed between the ceramic shield 30 and the interior of the plasma chamber 14. In accordance with the above disclosure, the barrier 40 effectively acts as a Faraday shield (cage) which, though non-transparent to the electrostatic component of the rf power from the antennas 18, is effectively transparent to the inductive component of this rf power. It is, of course, the propagated inductive component of the rf power that is useful in generating the plasma in the plasma chamber 14. Thus, while being functionally transparent to the rf power, the barrier 40 also provides a structural shield (barrier) which prevents material from the plasma being deposited on the ceramic shield 30.

While the particular Shielded RF Antenna as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A device for generating a plasma which comprises:
   a wall formed to establish an enclosed chamber;
   an antenna positioned adjacent said wall to surround said chamber;
   a means connected to said antenna for energizing said antenna to generate a plasma in said chamber, the plasma containing material components;
   a shield mounted on said wall with said antenna located between said wall and said shield to isolate said antenna from the plasma in said chamber; and
   a barrier mounted on said wall with said shield between said barrier and said antenna, said barrier being a non-transparent Faraday shield mounted on said wall to prevent deposition of the material components from the plasma on said shield.

2. A device as recited in claim 1 wherein said chamber is substantially cylindrical shaped and defines a longitudinal axis, and wherein said antenna comprises a plurality of metallic circular loops centered on said axis.

3. A device as recited in claim 2 further comprising a pair of side walls interconnecting said wall with said shield, wherein said side walls are distanced from each other to establish a pressure compartment therebetween, and between said wall and said shield, said device having at least one said circular loop positioned inside one said pressure compartment.

4. A device as recited in claim 2 wherein said energizing means uses an alternating voltage to produce rf power for generating the plasma.

5. A device as recited in claim 4 wherein said energizing means further comprises a means for controlling a relative phase between adjacent said circular loops.

6. A device as recited in claim 1 wherein said shield is made of a ceramic material.

7. A device as recited in claim 6 wherein said ceramic material is quartz.

8. A device as recited in claim 2 wherein said non-transparent Faraday shield comprises:
   an inner perforated layer having a plurality of elongated openings; and
   an outer perforated layer having a plurality of elongated openings, said inner and outer layers being substantially cylindrical shaped and coaxially oriented with said elongated openings aligned substantially parallel to said longitudinal axis and with said openings through said inner layer being offset from said openings through said outer layer to block said shield from said enclosed chamber.

9. A device for generating a plasma which comprises:
   a substantially cylindrical shaped chamber defining a longitudinal axis and having a wall formed with at least one pressure compartment, said pressure compartment being substantially annular shaped and centered around said axis, said pressure compartment further including a ceramic shield positioned between said wall of said chamber and said axis;
   an antenna positioned inside said pressure compartment to radiate rf power through said ceramic shield and into said chamber to generate a plasma inside said chamber, the plasma containing material components; and
   a non-transparent Faraday shield mounted on said wall with said ceramic shield between said Faraday shield and said antenna to prevent deposition of material components from the plasma on said ceramic shield.

10. A device as recited in claim 9 further comprising a means connected with said antenna for energizing said antenna with an alternating voltage to generate the rf power.

11. A device as recited in claim 10 wherein said antenna comprises a plurality of metallic loops centered on said axis.

12. A device as recited in claim 11 wherein said energizing means uses an alternating voltage to produce rf power for generating the plasma.

13. A device as recited in claim 12 wherein said energizing means further comprises a means for controlling a relative phase between adjacent said circular loops.

14. A device as recited in claim 9 wherein said ceramic shield is made of quartz.

15. A device as recited in claim 9 wherein said non-transparent Faraday shield comprises:
    an inner perforated layer having a plurality of elongated openings; and
    an outer perforated layer having a plurality of elongated openings, said inner and outer layers being substantially cylindrical shaped and coaxially oriented with said elongated openings aligned substantially parallel to said longitudinal axis and with said openings through said inner layer being offset from said openings through said outer layer to block said shield from said enclosed chamber.

16. A method for generating a plasma with a shielded rf antenna which comprises the steps of:
    providing a device having a wall surrounding an enclosed chamber, said device including an antenna positioned adjacent said wall and a shield mounted on said wall with said antenna between said wall and said shield, said device further including a barrier mounted on said wall with said shield between said barrier and said antenna, said barrier being a non-transparent Faraday shield;
    energizing said antenna element with an alternating voltage to generate a plasma in said chamber, the plasma containing material components;
    using said shield to isolate said antenna from the plasma in said chamber;
    and
    positioning said barrier to prevent deposition of said material components from the plasma on said shield.

17. A method as recited in claim 16 further comprising the step of confining said antenna in a pressure compartment, said pressure compartment being established by said wall, said shield and an adjacent pair of opposed side walls.

18. A method as recited in claim 16 wherein said antenna comprises a plurality of metallic circular loops positioned in a substantially side-by-side relationship with each other, and said method further comprises the step of controlling a relative phase between adjacent said circular loops.

* * * * *